0

United States Patent
Wei et al.

(10) Patent No.: US 10,396,256 B2
(45) Date of Patent: Aug. 27, 2019

(54) ELECTRONIC DEVICE PACKAGE

(71) Applicants: Industrial Technology Research Institute, Hsinchu (TW); Intellectual Property Innovation Corporation, Hsinchu (TW)

(72) Inventors: Hsiao-Fen Wei, New Taipei (TW); Kun-Lin Chuang, Hsinchu (TW); Yen-Ching Kuo, Keelung (TW); Kuan-Ting Chen, Yunlin County (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/969,790

(22) Filed: May 3, 2018

(65) Prior Publication Data
US 2019/0058094 A1 Feb. 21, 2019

Related U.S. Application Data

(60) Provisional application No. 62/547,118, filed on Aug. 18, 2017.

(30) Foreign Application Priority Data

Mar. 7, 2018 (TW) .............................. 107107532 A

(51) Int. Cl.
*H01L 23/28* (2006.01)
*H01L 33/52* (2010.01)
(Continued)

(52) U.S. Cl.
CPC ............ *H01L 33/52* (2013.01); *H01L 23/291* (2013.01); *H01L 23/3135* (2013.01);
(Continued)

(58) Field of Classification Search
CPC .......................... H01L 23/291; H01L 23/3192
See application file for complete search history.

(56) References Cited

U.S. PATENT DOCUMENTS

| | | | |
|---|---|---|---|
| 5,790,304 | A | 8/1998 | Sanders et al. |
| 6,949,389 | B2 | 9/2005 | Pichler et al. |

(Continued)

FOREIGN PATENT DOCUMENTS

| | | |
|---|---|---|
| CN | 1665352 | 9/2005 |
| CN | 1877411 | 12/2006 |

(Continued)

OTHER PUBLICATIONS

"Office Action of Taiwan Counterpart Application", dated Feb. 23, 2018, p. 1-p. 3.

(Continued)

*Primary Examiner* — Ermias T Woldegeorgis
(74) *Attorney, Agent, or Firm* — JCIPRNET

(57) ABSTRACT

An electronic device package includes a substrate, an electronic device, and a first packaging layer. The electronic device and the first packaging layer are disposed on the substrate and the electronic device is located between the substrate and the first packaging layer. The first packaging layer includes a first oxynitride layer and a second oxynitride layer, wherein the second oxynitride layer is located between the first oxynitride layer and the electronic device. A composition of the first oxynitride layer includes $SiN_{x1}O_{y1}$, a composition of the second oxynitride layer includes $SiN_{x2}O_{y2}$, and $x1 > x2$.

19 Claims, 6 Drawing Sheets

(51) Int. Cl.
*H01L 23/00* (2006.01)
*H01L 51/52* (2006.01)
*H01L 27/32* (2006.01)
*H01L 33/48* (2010.01)
*H01L 23/29* (2006.01)
*H01L 23/31* (2006.01)
*H01L 51/44* (2006.01)
*H01L 33/56* (2010.01)

(52) U.S. Cl.
CPC .......... *H01L 23/564* (2013.01); *H01L 27/326* (2013.01); *H01L 33/483* (2013.01); *H01L 51/448* (2013.01); *H01L 51/52* (2013.01); *H01L 51/5256* (2013.01); *H01L 33/56* (2013.01)

(56) References Cited

U.S. PATENT DOCUMENTS

| | | | |
|---|---|---|---|
| 7,074,501 | B2 | 7/2006 | Czeremuszkin et al. |
| 9,093,669 | B2 | 7/2015 | Park et al. |
| 9,698,377 | B1 | 7/2017 | Wu et al. |
| 2003/0205845 | A1 | 11/2003 | Pichler et al. |
| 2011/0132449 | A1 | 6/2011 | Ramadas et al. |
| 2012/0193816 | A1 | 8/2012 | Schmid et al. |
| 2013/0153880 | A1 | 6/2013 | Yamamoto et al. |
| 2014/0179040 | A1 | 6/2014 | Ramadas et al. |
| 2015/0307750 | A1 | 10/2015 | Nishijima et al. |
| 2017/0145249 | A1* | 5/2017 | Yun ................ C08F 222/14 |

FOREIGN PATENT DOCUMENTS

| | | |
|---|---|---|
| CN | 101409215 | 4/2009 |
| CN | 102790095 | 11/2012 |
| CN | 105073406 | 6/2017 |
| TW | 200703671 | 1/2007 |
| TW | 201008768 | 3/2010 |
| TW | 201143503 | 12/2011 |
| TW | 201318161 | 5/2013 |
| TW | 201324888 | 6/2013 |
| TW | 201404601 | 2/2014 |
| TW | 201430909 | 8/2014 |
| TW | 201546215 | 12/2015 |

OTHER PUBLICATIONS

"Office Action of Taiwan Related Application, application No. 106145424", dated Aug. 24, 2018, p. 1-p. 6.

"Office Action of Taiwan Counterpart Application", dated Sep. 18, 2018, p. 1-p. 4.

* cited by examiner

ELECTRONIC DEVICE PACKAGE

CROSS-REFERENCE TO RELATED APPLICATION

This application claims the priority benefits of a U.S. provisional application Ser. No. 62/547,118, filed on Aug. 18, 2017 and a Taiwan application serial no. 107107532, filed on Mar. 7, 2018. The entirety of each of the above-mentioned patent applications is hereby incorporated by reference herein.

TECHNICAL FIELD

The disclosure relates to an electronic device package.

BACKGROUND

With the increasingly sophisticated design of electronic devices and wider applications thereof, the demand for the moisture/oxygen blocking capability of electronic products has also increased. In general, electronic devices may achieve moisture/oxygen-blocking effect via a packaging technique to protect the electronic devices inside and to prevent failure or performance attenuation, or even damage, to the electronic devices. Therefore, the packaging technique of electronic devices is constantly improving in terms of moisture/oxygen blocking capability.

SUMMARY

The electronic device package of an embodiment of the disclosure includes a substrate, an electronic device, and a first packaging layer. The electronic device and the first packaging layer are disposed on the substrate and the electronic device is located between the substrate and the first packaging layer. The first packaging layer includes a first oxynitride layer and a second oxynitride layer, wherein the second oxynitride layer is located between the first oxynitride layer and the electronic device. A composition of the first oxynitride layer includes $SiN_{x1}O_{y1}$, a composition of the second oxynitride layer includes $SiN_{x2}O_{y2}$, and x1>x2.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
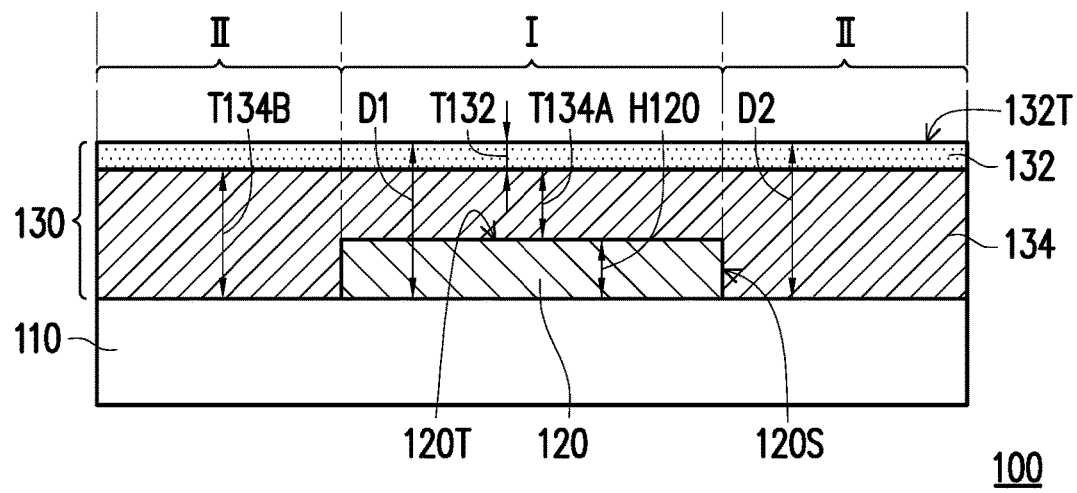
FIG. 1 to FIG. 11 are schematic views showing a respective electronic device package of various embodiments of the disclosure.

FIG. 1 is a schematic view of an electronic device package of an embodiment of the disclosure. Referring to FIG. 1, an electronic device package 100 includes a substrate 110, an electronic device 120, and a first packaging layer 130. The electronic device 120 and the first packaging layer 130 are disposed on the substrate 110, and the electronic device 120 is located between the first packaging layer 130 and the substrate 110. In the present embodiment, the electronic device 120 is covered by the first packaging layer 130, and the first packaging layer 130 is in contact with a top surface 120T and a side surface 120S of the electronic device 120. In other words, the electronic device 120 is packaged by and between the substrate 110 and the first packaging layer 130.

The substrate 110 has supporting properties and may support the electronic device 120 thereon. Moreover, the substrate 110 may optionally have flexibility, and therefore the electronic device package 100 may be applied in a flexible product. The material of the substrate 110 may include, for instance, polyethylene terephthalate (PET), polyethylene naphthalate (PEN), polyethersulfone (PES), polymethyl methacrylate (PMMA), polycarbonate (PC), polyimide (PI), metal foil, metal, glass, or silicon. Moreover, a film layer such as a buffer layer or an anti-reflection layer improving effects such as the adhesion properties of the substrate 110 with a device thereon and the optical properties of the final product may be optionally disposed on the surface of the substrate 110. These auxiliary film layers may be disposed on the surface of the substrate 110 in a blanket manner.

The electronic device 120 may include, for instance, a mini LED, micro LED, OLED lighting, organic photovoltaic (OPV) cell, or a quantum dot light-emitting layer. In some embodiments, in the case of a driving method, the electronic device 120 is, for instance, an active electronic device or a passive electronic device. If the electronic device package 100 is applied in a display device, then the active electronic device includes an active matrix organic light-emitting diode (AM-OLED), an active matrix electro phoretic display (AM-EPD), an active matrix liquid crystal display (AM-LCD), or an active matrix blue-phase liquid crystal display. The passive electronic device may be, for instance, a passive matrix OLED (PM-OLED) or a super-twisted nematic liquid crystal display (STN-LCD). The electronic device 120 may be an environmentally-sensitive electronic device sensitive to moisture and oxygen in the environment, or moisture and oxygen in the environment may negatively affect the electronic device 120. In the electronic device package 100 of the present embodiment, the first packaging layer 130 covers the electronic device 120.

The first packaging layer 130 includes a first oxynitride layer 132 and a second oxynitride layer 134, wherein the second oxynitride layer 134 is located between the first oxynitride layer 132 and the electronic device 120. The second oxynitride layer 134 is located between the first oxynitride layer 132 and the substrate 110, and the electronic device 120 is located between the second oxynitride layer 134 and the substrate 110. In the present embodiment, the electronic device 120 is covered by the second oxynitride layer 134, and the second oxynitride layer 134 is in contact with the top surface 120T and the side surface 120S of the electronic device 120.

In the present embodiment, the manufacturing method of the first packaging layer 130 may include coating a packaging material on the substrate 110 and the electronic device 120 via a solution process, wherein the material thereof includes polysilazane, polysiloxazane, or other suitable materials. Next, a surface plasma treatment is performed on the surface of the packaging material on the substrate 110. As a result, the packaging material subjected to plasma effect forms the first oxynitride layer 132 and the packaging material not subjected to plasma effect forms the second oxynitride layer 134. The first oxynitride layer 132 may be in direct contact with the second oxynitride layer 134. Moreover, a thickness T132 of the first oxynitride layer 132 may be decided by, for instance, the depth of the plasma treatment, and the thickness thereof is, for instance, 1 nm to 30 nm. Thicknesses T134A and T134B of the second oxynitride layer 134 may be decided by the coating thickness of the packaging material. In general, the location of the second oxynitride layer 134 in the electronic device 120 has a thickness T134A and the region outside the electronic device 120 has a thickness T134B, and the thickness T134A and the thickness T134B may be greater than the thickness T132. Moreover, the thickness T134B may be greater than the thickness T134A, or even equal to the sum of the thickness T134A and a thickness H120 of the electronic device 120, and therefore the first packaging layer 130 covering the electronic device 120 may provide a planarizing effect. If the region in which the electronic device 120 is located is defined as a first region I of the substrate 110 and the region outside the electronic device 120 is defined as a second region II of the substrate 110, under the planarizing effect provided by the first packaging layer 130, a first distance D1 from the top surface 132T of the first oxynitride layer 132 to the substrate at the first region I and a second distance D2 from the top surface 132T of the first oxynitride layer 132 to the substrate 110 at the second region II may be substantially the same. Alternatively, the difference between the first distance D1 and the second distance D2 may be less than the thickness H120 of the electronic device 120.

In the present embodiment, the first oxynitride layer 132 is subjected to a plasma treatment, and therefore the density of the first oxynitride layer 132 may be greater than that of the second oxynitride layer 134. For instance, the visible light transmittance of the first oxynitride layer 132 may be less than 80% and the visible light transmittance of the second oxynitride layer 134 may be greater than 80%. The first oxynitride layer 132 and the second oxynitride layer 134 may have sufficient visible light transmittance, thus facilitating the application of the electronic device package 100 in a transparent display as a display panel for transparent display. In some embodiments, the refractive indices of the first oxynitride layer 132 and the second oxynitride layer 134 may be 1.5 to 1.7. In comparison to the second oxynitride layer 134, the first oxynitride layer 132 may have better moisture/oxygen blocking capability. In some embodiments, the water vapor transmission rate (WVTR) of the first packaging layer 130 may be less than $5 \times 10^{-4}$ g/m$^2$ day to provide the moisture/oxygen-blocking effect.

In some embodiments, although the first oxynitride layer 132 and the second oxynitride layer 134 are formed by the same starting material (packaging material), the first oxynitride layer 132 subjected to plasma treatment is relatively more difficult to be hydrolyzed, and the second oxynitride layer 134 may be subjected to the moisture/oxygen effect from the environment or the electronic device 120. The first oxynitride layer 132 may have a higher nitrogen content and the second oxynitride layer 134 may have a lower nitrogen content (or higher oxygen content). In other words, although the first oxynitride layer 132 and the second oxynitride layer 134 are formed by the same starting material (packaging material), the two may be differentiated by the composition components. In some embodiments, the content of the N element in the first oxynitride layer 132 is 7 at % (atomic percentage) to 50 at %, and the content of the N element in the second oxynitride layer 134 may be less than 7 at %.

For instance, the composition of the first oxynitride layer 132 includes $SiN_{x1}O_{y1}$, the composition of the second oxynitride layer 134 includes $SiN_{x2}O_{y2}$, and x1>x2. In some of the embodiments, the composition of the first oxynitride layer 132 may be substantially the same as the composition of the starting material (packaging material), and the values of x1 and y1 may be decided by the starting material. In some embodiments, the N element content in the first oxynitride layer 132 may be gradually decreased from the surface inward. That is, the region with the most nitrogen element content in the first oxynitride layer 132 is substantially located on the surface, and the nitrogen element content is gradually decreased toward the second oxynitride layer 134. In comparison, the nitrogen element content at locations with different thicknesses in the second oxynitride layer 134 may be substantially kept consistent. Moreover, the first oxynitride layer 132 subjected to plasma treatment may further include a doping element. The doping element may be a composition element for a gas used in plasma, and includes, for instance, hydrogen, nitrogen, oxygen, an inert gas, or a combination thereof. In some embodiments, the content of the doping element in the first oxynitride layer 132 may exceed 0 at % to 5 at %. Moreover, the difference between the nitrogen content of the first oxynitride layer 132 and the nitrogen content of the second oxynitride layer 134 may be 0 at % to 50 at %.

Figure 2:
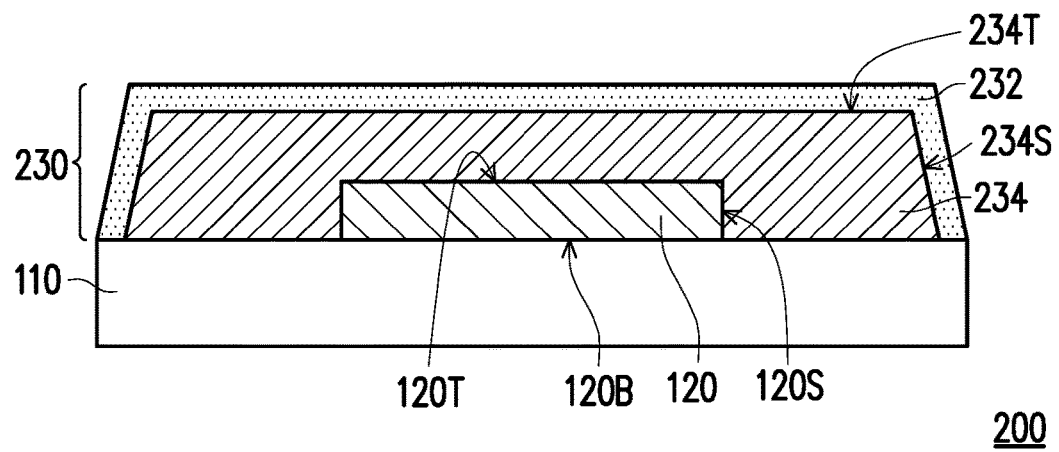

FIG. 2 is a schematic view of an electronic device package of another embodiment of the disclosure. An electronic device package 200 of FIG. 2 includes a substrate 110, an electronic device 120, and a first packaging layer 230. The electronic device package 200 is substantially similar to the electronic device package 100 of FIG. 1, and in the present embodiment, the first packaging layer 230 may have an island structure. During the manufacture of the first packaging layer 230, a packaging material may be first coated on the substrate 110 and the electronic device 120 via a solution process, and the material thereof includes polysilazane, polysiloxazane, or other suitable materials. At this point, the packaging material may form an island structure via a process method and/or condition control (such as coating range and solution viscosity). Next, a surface plasma treatment is performed on the top surface and side surface of the packaging material on the substrate 110 to form the first packaging layer 230 shown in FIG. 2.

In the present embodiment, the first packaging layer 230 includes a first oxynitride layer 232 and a second oxynitride layer 234. The first oxynitride layer 232 covers a top surface 234T and a side surface 234S of the second oxynitride layer 234 and the second oxynitride layer 234 covers the top surface 120T and the side surface 120S of the electronic device 120. A portion of the first oxynitride layer 232 and a portion of the second oxynitride layer 234 may be extended to a plane in which a bottom surface 120B of the electronic device 120 is located. In some embodiments, the plane in which the bottom surface 120B of the electronic device 120 is located may be the surface of the substrate 110, or the film layer surface on the substrate 110.

It may be known from FIG. 2 that, the first oxynitride layer 232 has a shell-like structure to cover the second oxynitride layer 234. The second oxynitride layer 234 may be completely packaged between the first oxynitride layer 232 and the substrate 110. The composition of the first oxynitride layer 232 includes $SiN_{x1}O_{y1}$, the composition of the second oxynitride layer 234 includes $SiN_{x2}O_{y2}$, and x1>x2. The composition components and properties of the first oxynitride layer 232 and the second oxynitride layer 234 are substantially the same as those of the first oxynitride layer 132 and the second oxynitride layer 134 of FIG. 1, and therefore relevant descriptions are not repeated herein.

Figure 3:
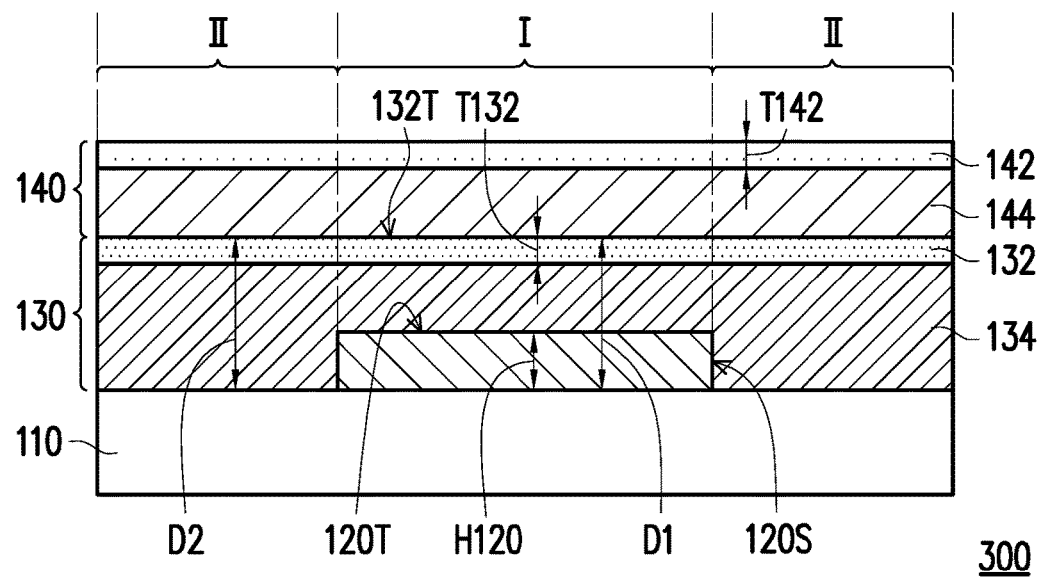

FIG. 3 is a schematic view of an electronic device package of an embodiment of the disclosure. Referring to FIG. 3, an electronic device package 300 includes a substrate 110, an electronic device 120, a first packaging layer 130, and a second packaging layer 140. In the present embodiment, the relative features of the substrate 110, the electronic device 120, and the first packaging layer 130 may be understood from the descriptions of the structures, relative configurations, compositions, and properties of the substrate 110, the electronic device 120, and the first packaging layer 130 provided in the embodiment of FIG. 1. The electronic device package 300 of the present embodiment further includes a second packaging layer 140.

The second packaging layer 140 includes a third oxynitride layer 142 and a fourth oxynitride layer 144, and the fourth oxynitride layer 144 is located between the third oxynitride layer 142 and the first packaging layer 130. In other words, the third oxynitride layer 142 is farther from the electronic device 120 relative to the fourth oxynitride layer 144. The composition of the third oxynitride layer 142 includes $SiN_{x3}O_{y3}$, and the composition of the fourth oxynitride layer 144 includes $SiN_{x4}O_{x4}$.

In the present embodiment, the manufacturing method of the second packaging layer 140 may be the same as that of the first packaging layer 130. In other words, in the present embodiment, after the manufacture of the first packaging layer 130 is complete, a packaging material is coated on the first packaging layer 130 via a solution process, and then a surface plasma treatment is performed. For instance, the surface of the packaging material on the first packaging layer 130 is bombarded by plasma. As a result, the third oxynitride layer 142 may be denser compared to the fourth oxynitride layer 144 and have higher content of the N element, and is less readily hydrolyzed or oxidized.

The first packaging layer 130 is present between the second packaging layer 140 and the electronic device 120, and the first packaging layer 130 has moisture/oxygen-blocking effect. The probability of moisture or oxygen from the electronic device 120 penetrating the second packaging layer 140 is less than the probability of penetrating the first packaging layer 130. Therefore, the moisture or oxygen from the electronic device 120 less readily affects the composition of the second packaging layer 140. In some embodiments, if the first packaging layer 130 and the second packaging layer 140 are manufactured with the same starting material, then between the composition $SiN_{x4}O_{y4}$ of the fourth oxynitride layer 144 and the composition $SiN_{x2}O_{y2}$ of the second oxynitride layer 134, x4≥x2. Moreover, the first oxynitride layer 132 and the third oxynitride layer 142 are subjected to plasma treatment and may have denser structures than the second oxynitride layer 134 and the fourth oxynitride layer 144.

In the present embodiment, the fourth oxynitride layer 144 is located between the plasma-treated first oxynitride layer 132 and the plasma-treated third oxynitride layer 142, and therefore moisture/oxygen from the environment or the electronic device 120 do not readily penetrate the fourth oxynitride layer 144. Regarding the composition $SiN_{x4}O_{y4}$ of the fourth oxynitride layer 144 and the composition $SiN_{x3}O_{y3}$ of the third oxynitride layer 142, x3≥x4 in some embodiments. Moreover, in the composition of the fourth oxynitride layer 144, the content of the N element may be 7 at % to 50 at %.

In the present embodiment, the first packaging layer 130 may provide a planarizing effect. For instance, if the region in which the electronic device 120 is located is defined as the first region I of the substrate 110 and the region outside the electronic device 120 is defined as the second region II of the substrate 110, under the planarizing effect provided by the first packaging layer 130, the first distance D1 from the top surface 132T of the first oxynitride layer 132 to the substrate 110 at the first region I and the second distance D2 from the top surface 132T of the first oxynitride layer 132 to the substrate 110 at the second region II may be substantially the same. Alternatively, the difference between the first distance D1 and the second distance D2 may be less than the thickness H120 of the electronic device 120. Moreover, the thickness of the second packaging layer 140 may be less than the thickness of the first packaging layer 130. However, a thickness T142 of the third oxynitride layer 142 may be substantially the same as the thickness T132 of the first oxynitride layer 132.

Figure 4:
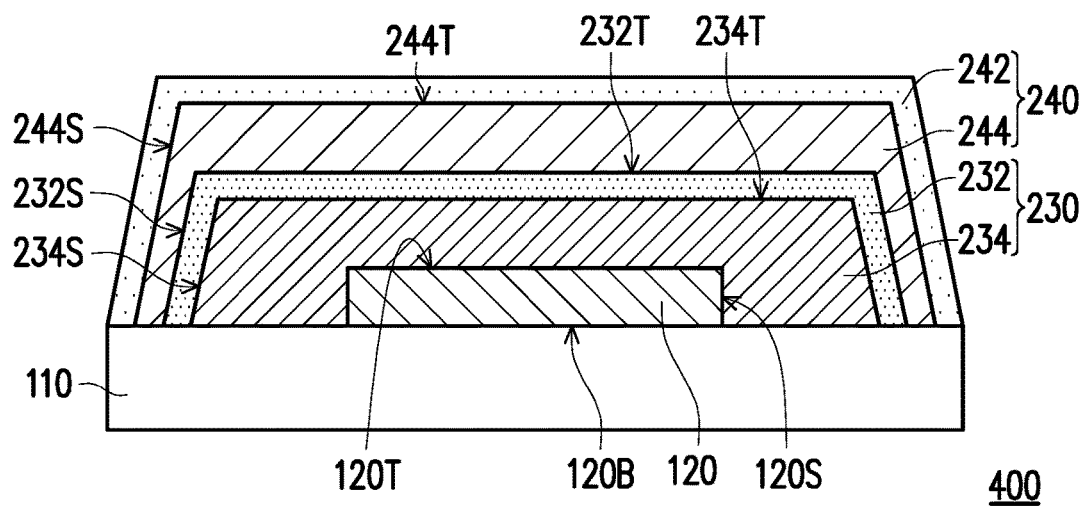

FIG. 4 is a schematic view of an electronic device package of yet another embodiment of the disclosure. An electronic device package 400 of FIG. 4 includes a substrate 110, an electronic device 120, a first packaging layer 230, and a second packaging layer 240. The electronic device package 400 is substantially similar to the electronic device package 300 of FIG. 3, and in the present embodiment, the first packaging layer 230 and the second packaging layer 240 may have an island structure. The first packaging layer 230 includes a first oxynitride layer 232 and a second oxynitride layer 234. The first oxynitride layer 232 covers a top surface 234T and a side surface 234S of the second oxynitride layer 234 and the second oxynitride layer 234 covers the top surface 120T and the side surface 120S of the electronic device 120. The second packaging layer 240 includes a third oxynitride layer 242 and a fourth oxynitride layer 244. The third oxynitride layer 242 covers a top surface 244T and a side surface 244S of the fourth oxynitride layer 244, and the fourth oxynitride layer 244 covers a top surface 232T and a side surface 232S of the first oxynitride layer 232. As a result, a portion of the first oxynitride layer 232, a portion of the second oxynitride layer 234, a portion of the third oxynitride layer 242, and a portion of the fourth oxynitride layer 244 may be extended to a plane in which the bottom surface 120B of the electronic device 120 is located. In some embodiments, the plane in which the bottom surface 120B of the electronic device 120 is located may be the surface of the substrate 110, or the film layer surface on the substrate 110.

The first oxynitride layer 232 has a shell-like structure to cover the second oxynitride layer 234, and the third oxynitride layer 242 has a shell-like structure to cover the fourth oxynitride layer 244. The second oxynitride layer 234 is completely packaged between the first oxynitride layer 232 and the substrate 110, and the fourth oxynitride layer 244 is completely packaged by the third oxynitride layer 242, the first oxynitride layer 232, and the substrate 110. In the present embodiment, the composition components and properties of the first oxynitride layer 232, the second oxynitride layer 234, the third oxynitride layer 242, and the fourth oxynitride layer 244 may be the same as those of the first oxynitride layer 132, the second oxynitride layer 134, the third oxynitride layer 142, and the fourth oxynitride layer 144 in FIG. 3.

Figure 5:
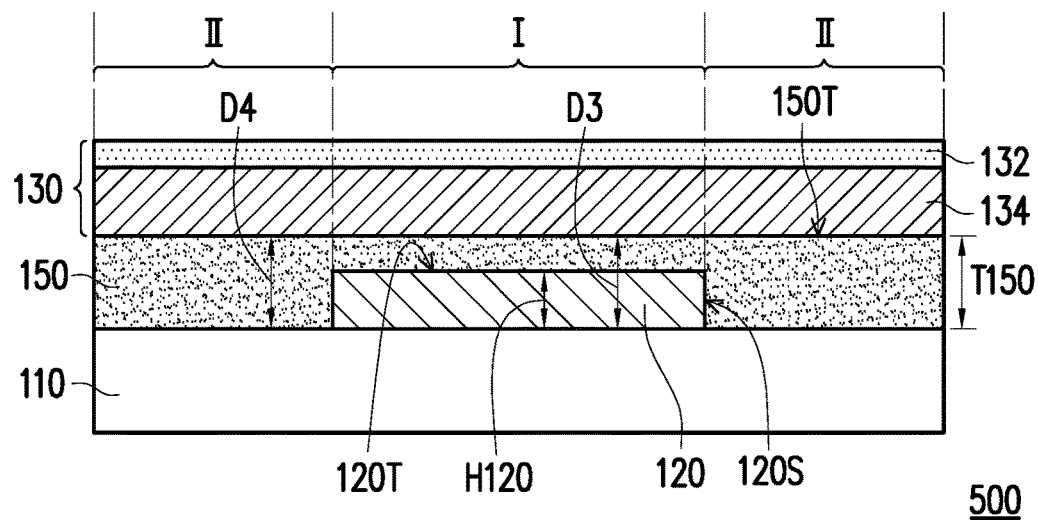

FIG. 5 is a schematic view of an electronic device package of yet another embodiment of the disclosure. Referring to FIG. 5, an electronic device package 500 includes a substrate 110, an electronic device 120, a first packaging layer 130, and a cover layer 150. In the present embodiment, the relative features of the substrate 110, the electronic device 120, and the first packaging layer 130 may be understood from the descriptions of the embodiment of FIG. 1.

The electronic device package 500 of the present embodiment further includes a cover layer 150. The electronic device 120 is located between the substrate 110 and the cover layer 150, and the cover layer 150 is located between the first packaging layer 130 and the substrate 110. In other words, the cover layer 150 may be in contact with a top surface 120T and a side surface 120S of the electronic device 120. A thickness T150 of the cover layer 150 is, for instance, in the range of 1 μm and 50 μm. The cover layer 150 may provide a planarizing effect. In some embodiments, if the region in which the electronic device 120 is located is defined as a first region I of the substrate 110, and the region outside the electronic device 120 is defined as a second region II of the substrate 110, under the planarizing effect provided by the cover layer 150, a first distance D3 from a top surface 150T of the cover layer 150 to the substrate 110 at the first region I and a second distance D4 from the top surface 150T of the cover layer 150 to the substrate 110 at the second region II may be substantially the same. Alternatively, the difference between the first distance D3 and the second distance D4 may be less than a thickness H120 of the electronic device 120.

The cover layer 150 may be a single-layer structure or a multilayer structure, and the material thereof includes an inorganic material, an organic material, or a combination thereof. In terms of inorganic materials, the material of the cover layer 150 includes $AlO_x$, $SiN_x$, $SiO_x$, SiON, ITO, IZO, or a combination of the materials. In terms of organic materials, the material of the cover layer 150 includes acrylic polymer, epoxy resin polymer, polyimide, or a combination of the materials. In some embodiments, the cover layer 150 may not contain a hydroxyl group (—OH), a carboxyl group (—COOH), toluene, or a similar compound. Moreover, the refractive index of the cover layer 150 may be between 1.4 and 1.8, which is close to the refractive index of the first packaging layer 130.

Figure 6:
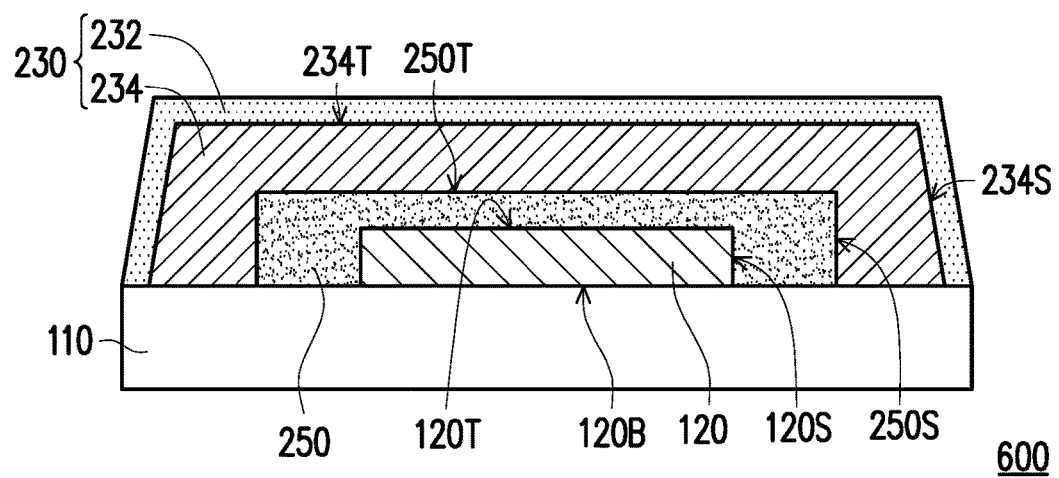

FIG. 6 is a schematic view of an electronic device package of yet another embodiment of the disclosure. An electronic device package 600 of FIG. 6 includes a substrate 110, an electronic device 120, a first packaging layer 230, and a cover layer 250. The electronic device package 600 is substantially similar to the electronic device package 500 of FIG. 5, and in the present embodiment, the first packaging layer 230 and the cover layer 250 have an island structure. The first packaging layer 230 includes a first oxynitride layer 232 and a second oxynitride layer 234. The cover layer 250 covers and is in contact with a top surface 120T and a side surface 120S of the electronic device 120, the second oxynitride layer 234 covers and is in contact with a top surface 250T and a side surface 250S of the cover layer 250, and the first oxynitride layer 232 covers and is in contact with a top surface 234T and a side surface 234S of the second oxynitride layer 234. Moreover, a portion of the cover layer 250, a portion of the first oxynitride layer 232, and a portion of the second oxynitride layer 234 may be extended to the plane in which a bottom surface 120B of the electronic device 120 is located.

Figure 7:
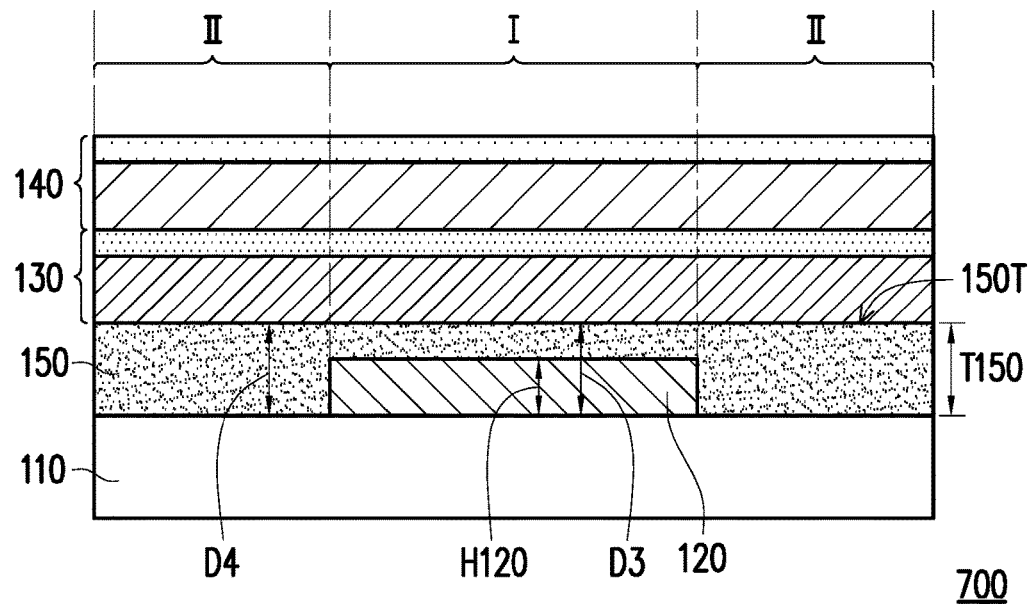

FIG. 7 is a schematic view of an electronic device package of yet another embodiment of the disclosure. Referring to FIG. 7, an electronic device package 700 includes a substrate 110, an electronic device 120, a first packaging layer 130, a second packaging layer 140, and a cover layer 150. In the present embodiment, the relative features of the substrate 110, the electronic device 120, the first packaging layer 130, and the second packaging layer 140 may be understood from the descriptions of the embodiment of FIG. 3. The electronic device package 700 of the present embodiment further includes a cover layer 150.

The electronic device 120 is located between the substrate 110 and the cover layer 150, the cover layer 105 is located between the first packaging layer 130 and the substrate 110, and the first packaging layer 130 is located between the second packaging layer 140 and the cover layer 150. The cover layer 150 is in contact with a top surface 120T and a side surface 120S of the electronic device 120. A thickness T150 of the cover layer 150 is, for instance, in the range of 1 μm and 50 μm. The cover layer 150 may provide a planarizing effect. In some embodiments, if the region in which the electronic device 120 is located is defined as a first region I of the substrate 110, and the region outside the electronic device 120 is defined as a second region II of the substrate 110, under the planarizing effect provided by the cover layer 150, a first distance D3 from the top surface 150T of the cover layer 150 to the substrate 110 at the first region I and a second distance D4 from the top surface 150T of the cover layer 150 to the substrate 110 at the second region II may be substantially the same. Alternatively, the difference between the first distance D3 and the second distance D4 may be less than a thickness H120 of the electronic device 120.

The cover layer 150 may be a single-layer structure or a multilayer structure, and the material thereof includes an inorganic material, an organic material, or a combination thereof. In terms of inorganic materials, the material of the cover layer 150 includes $AlO_x$, $SiN_x$, $SiO_x$, SiON, ITO, IZO, or a combination of the materials. In terms of organic materials, the material of the cover layer 150 includes acrylic polymer, epoxy resin polymer, polyimide, or a combination of the materials. In some embodiments, the cover layer 150 may not contain a hydroxyl group (—OH), a carboxyl group (—COOH), toluene, or a similar compound. Moreover, the refractive index of the cover layer 150 may fall between 1.4 and 1.8, which is close to the refractive index of the first packaging layer 130 and/or the second packaging layer 140.

Figure 8:
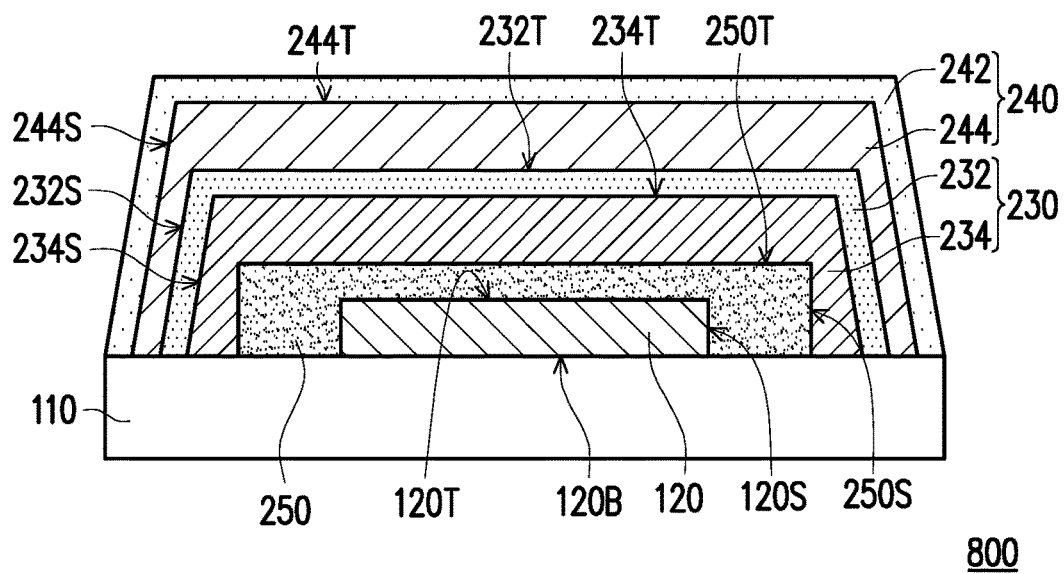

FIG. 8 is a schematic view of an electronic device package of yet another embodiment of the disclosure. An electronic device package 800 of FIG. 8 includes a substrate 110, an electronic device 120, a first packaging layer 230, a second packaging layer 240, and a cover layer 250. The electronic device package 800 is substantially similar to the electronic device package 700 of FIG. 7.

In the present embodiment, the first packaging layer 230, the second packaging layer 240, and the cover layer 250 together form an island structure. The first packaging layer 230 includes a first oxynitride layer 232 and a second oxynitride layer 234, and the second packaging layer 240 includes a third oxynitride layer 242 and a fourth oxynitride layer 244. The cover layer 250 covers and is in contact with a top surface 120T and a side surface 120S of the electronic device 120, the second oxynitride layer 234 covers and is in contact with a top surface 250T and a side surface 250S of the cover layer 250, the first oxynitride layer 232 covers and is in contact with a top surface 234T and a side surface 234S of the second oxynitride layer 234, the fourth oxynitride layer 244 covers and is in contact with a top surface 232T and a side surface 232S of the first oxynitride layer 232, and the third oxynitride layer 242 covers and is in contact with a top surface 244T and a side surface 244S of the fourth oxynitride layer 244. Moreover, a portion of the cover layer 250, a portion of the first oxynitride layer 232, a portion of the second oxynitride layer 234, a portion of the third oxynitride layer 242, and a portion of the fourth oxynitride layer 244 may be extended to the plane in which a bottom surface 120B of the electronic device 120 is located.

Figure 9:
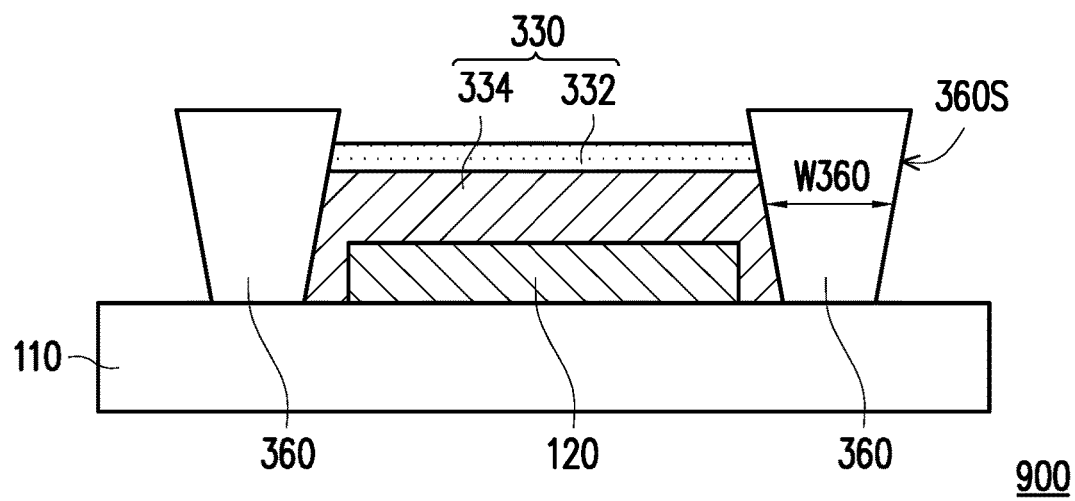

FIG. 9 is a schematic view of an electronic device package of an embodiment of the disclosure. An electronic device package 900 of FIG. 9 includes a substrate 110, an electronic device 120, a first packaging layer 330, and a surrounding structure layer 360. The substrate 110 and the electronic device 120 in the electronic device package 900 are substantially similar to those in the electronic device package 100 of FIG. 1. In the present embodiment, the surrounding structure layer 360 is disposed on the substrate 110, and the electronic device 120 and the first packaging layer 330 are located in a region surrounded by the surrounding structure layer 360. The first packaging layer 330 may be similar to the first packaging layer 130 of FIG. 1, and the first packaging layer 330 includes a first oxynitride layer 332 and a second oxynitride layer 334. In the present embodiment, the manufacturing method and properties of the first oxynitride layer 332 and the second oxynitride layer 334 may be similar to or even the same as those of the first oxynitride layer 132 and the second oxynitride layer 134 of the embodiments above.

The surrounding structure layer 360 may be formed by a dielectric material, such as epoxy resin, acrylic resin, or polyimide. The thickness of the surrounding structure layer 360 is greater than the thickness of the electronic device 120, and the surrounding structure layer 360 may be configured to define the region in which the electronic device 120 is disposed. When viewed from the top (not shown), the surrounding structure layer 360 may be a structure having a frame pattern, and may also be a structure having a plurality of stripe patterns. In some embodiments, the surrounding structure layer 360 may be regarded as a pixel-defining layer or a film layer with similar function. Moreover, via the selection of a suitable material, the surrounding structure layer 360 may have the function of blocking moisture and oxygen to provide the moisture and oxygen blocking effect.

In an embodiment, the manufacture process of the electronic device package 900 may include forming the first packaging layer 330 in the region surrounded by the surrounding structure layer 360 after the manufacture of the surrounding structure layer 360 is complete. The first oxynitride layer 332 and the second oxynitride layer 334 may be in contact with the surrounding structure layer 360. The thickness of the first packaging layer 330 may be less than or equal to the thickness of the surrounding structure layer 360, and the first packaging layer 330 is located in a region surrounded by the surrounding structure layer 360 and is not extended outside the region surrounded by the surrounding structure layer 360. However, the disclosure is not limited thereto.

Moreover, a radial width W360 of the surrounding structure layer 360 may be defined as the width measured parallel to the substrate 110. The radial width W360 of the surrounding structure layer 360 may be gradually changed from the substrate 110 outwardly to form a side surface 360S not perpendicular to the substrate 110. In terms of FIG. 9, the radial width W360 may be gradually increased at a fixed rate of change from the substrate 110 outwardly to form an inverted trapezoid structure that is wide on top (the side away from the substrate 110) and narrow on the bottom (the side adjacent to the substrate 110). In other embodiments, the radial width W360 may be fixed or gradually increased at a variable rate of change from the substrate 110 outwardly, and therefore the side surface 360S may be a rectangular or zig-zag surface or an arched surface. The radial width W360 may also have a fixed rate of change from the substrate 110 outwardly or a variable gradually-decreasing rate of change to form a structure that is narrow on top (the side away from the substrate 110) and wide on the bottom (the side adjacent to the substrate 110), such as a trapezoid structure or a triangle structure.

In some embodiments, the electronic device package 900 may further include at least one of the cover layer 150 and the second packaging layer 140 above. For instance, the electronic device package 900 further includes the second packaging layer 140 in FIG. 3, and the second packaging layer 140 is disposed on the first packaging layer 330. At this point, the first packaging layer 330 and the second packaging layer 140 may be disposed in a region surrounded by the surrounding structure layer 360 and not extended outside the region surrounded by the surrounding structure layer 360. Alternatively, the second packaging layer 140 may be extended outside the region surrounded by the surrounding structure layer 360 while the first packaging layer 330 is not. Moreover, the electronic device package 900 may further include the cover layer 150 of FIG. 5, wherein the electronic device 120 is covered by the cover layer 150. At this point, the thickness of the cover layer 150 may be less than the thickness of the surrounding structure layer 360. Alternatively, the electronic device package 900 may further include the second packaging layer 140 and the cover layer 150 of FIG. 7. The first packaging layer 330 and the cover layer 150 may be disposed in the region surrounded by the surrounding structure layer 360, and the second packaging layer 140 may be optionally disposed in the region surrounded by the surrounding structure layer 360 or extended outside the region surrounded by the surrounding structure layer 360. Alternatively, the thickness of the cover layer 150 may be less than the thickness of the surrounding structure layer 360.

Figure 10:
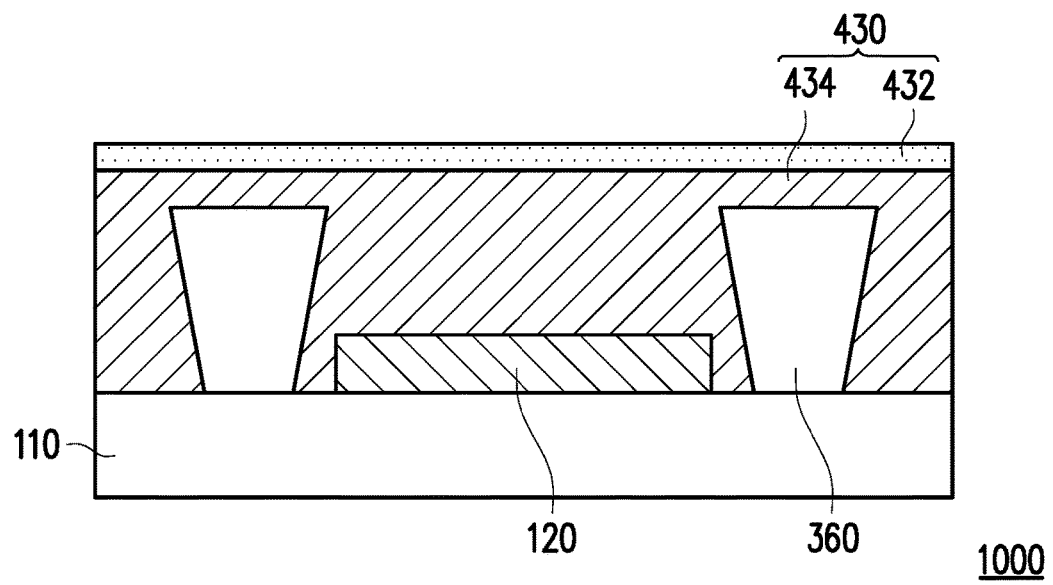

FIG. 10 is a schematic view of an electronic device package of yet another embodiment of the disclosure. An electronic device package 1000 of FIG. 10 includes a substrate 110, an electronic device 120, a first packaging layer 430, and a surrounding structure layer 360. The electronic device package 1000 is substantially similar to the electronic device package 900 of FIG. 9. In the present embodiment, the thickness of the first packaging layer 430 is greater than the thickness of the surrounding structure layer 360. The first packaging layer 430 may be similar to the first packaging layer 130 of FIG. 1, and the first packaging layer 430 includes a first oxynitride layer 432 and a second oxynitride layer 434. In the present embodiment, the manufacturing method and properties of the first oxynitride layer 432 and the second oxynitride layer 434 may be similar to or even the same as those of the first oxynitride layer 132 and the second oxynitride layer 134 of the embodiments above. Moreover, the surrounding structure layer 360 is similar to the surrounding structure layer 360 of FIG. 9.

In the present embodiment, the thickness of the first packaging layer 430 may be greater than the thickness of the surrounding structure layer 360, and the first packaging layer 430 may be not limited to the region surrounded by the surrounding structure layer 360. The first packaging layer 430 substantially completely covers the electronic device 120 and the surrounding structure layer 360 such that the surrounding structure layer 360 and the electronic device 120 are embedded in the first packaging layer 430 and are covered and sealed. In some embodiments, the electronic device package 1000 may further include at least one of the cover layer 150 and the second packaging layer 140 above.

In an embodiment with the cover layer 150 (not shown), the thickness of the cover layer 150 may be less than, equal to, or greater than that of the surrounding structure layer 360. The cover layer 150 may be optionally be located in a region surrounded by the surrounding structure layer 360 or extended from the region surrounded by the surrounding structure layer 360 to outside the region surrounded by the surrounding structure layer 360. The cover layer 150 may optionally partially or completely cover the surrounding structure layer 360.

Figure 11:
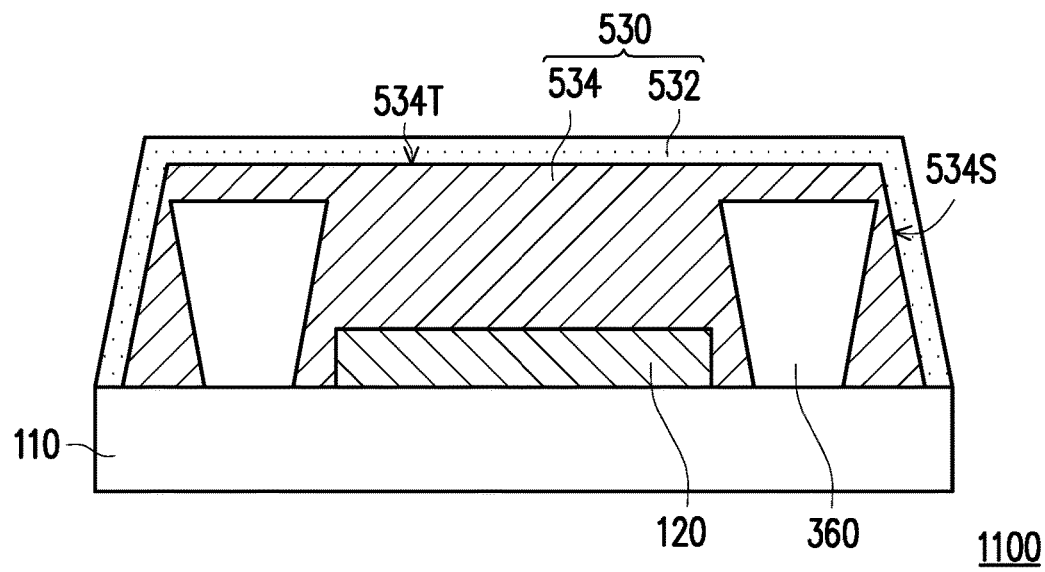

FIG. 11 is a schematic view of an electronic device package of yet another embodiment of the disclosure. An electronic device package 1100 of FIG. 11 includes a substrate 110, an electronic device 120, a first packaging layer 530, and a surrounding structure layer 360. The electronic device package 1100 is substantially similar to the electronic device package 1000 of FIG. 10. In the present embodiment, the thickness of the first packaging layer 530 is greater than the thickness of the surrounding structure layer 360. The first packaging layer 530 may be similar to the first packaging layer 230 of FIG. 2, and the first packaging layer 530 includes a first oxynitride layer 532 and a second oxynitride layer 534. In the present embodiment, the manufacturing method and properties of the first oxynitride layer 532 and the second oxynitride layer 534 may be similar to or even the same as those of the first oxynitride layer 232 and the second oxynitride layer 234 of the embodiments above. Moreover, the surrounding structure layer 360 is similar to the surrounding structure layer 360 of FIG. 9.

In the present embodiment, the thickness of the second oxynitride layer 534 of the first packaging layer 530 may be greater than the thickness of the surrounding structure layer 360, and the first packaging layer 530 may be not limited to the region surrounded by the surrounding structure layer 360. The first packaging layer 530 substantially completely covers the electronic device 120 and the surrounding structure layer 360 such that the surrounding structure layer 360 and the electronic device 120 are embedded in the first packaging layer 530 and sealed. Moreover, the first oxynitride layer 532 has a shell-like structure to cover the second oxynitride layer 534. In other words, the first oxynitride layer 532 covers a top surface 534T and a side surface 534S of the second oxynitride layer 534, and the second oxynitride layer 534 covers the electronic device 120.

In some embodiments, the electronic device package 1100 may further include at least one of the cover layer 250 and the second packaging layer 240 above. For instance, the electronic device package 1100 may further include the second packaging layer 240 in FIG. 4, and the second packaging layer 240 is disposed on the first packaging layer 530. Moreover, the electronic device package 1100 may further include the cover layer 250 of FIG. 6, wherein the thickness of the cover layer 250 may be less than, equal to, or greater than the surrounding structure layer 360. The cover layer 250 may optionally partially or completely cover the surrounding structure layer 360. Alternatively, the electronic device package 1100 may further include the second packaging layer 240 and the cover layer 250 of FIG. 8. The cover layer 250 may be disposed in the region surrounded by the surrounding structure layer 360 or extended from the region surrounded by the surrounding structure layer 360 to outside the region surrounded by the surrounding structure layer 360. The thickness of the cover layer 250 may be greater than, equal to, or less than the thickness of the surrounding structure layer 360. The cover layer 250 may optionally partially or completely cover the surrounding structure layer 360.

The electronic device package of an embodiment of the disclosure adopts at least one packaging layer to cover the electronic device disposed on the substrate, and the packaging layer is formed by a packaging material. The packaging layer of some embodiments includes a first oxynitride layer and a second oxynitride layer, and the film layers in the first oxynitride layer and the second oxynitride layer relatively distant from the electronic device have relatively high nitrogen content, and therefore the packaging layer has the moisture/oxygen-blocking effect. The electronic device package may effectively prevent deterioration or performance loss of the electronic device due to the invasion of moisture/oxygen, such that the electronic device has good reliability and service life.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electronic device package, comprising:
a substrate;
an electronic device disposed on the substrate; and
a first packaging layer disposed on the substrate, wherein the electronic device is located between the substrate and the first packaging layer, the first packaging layer comprises a first oxynitride layer and a second oxynitride layer, the second oxynitride layer is located between the first oxynitride layer and the electronic device, a composition of the first oxynitride layer comprises $SiN_{x1}O_{y1}$, a composition of the second oxynitride layer comprises $SiN_{x2}O_{y2}$, and $x1>x2$, wherein the first oxynitride layer comprises a doping element.

2. The electronic device package of claim 1, further comprising a second packaging layer disposed on the substrate, wherein the first packaging layer is located between the substrate and the second packaging layer.

3. The electronic device package of claim 2, wherein the second packaging layer comprises a third oxynitride layer and a fourth oxynitride layer, the fourth oxynitride layer is located between the third oxynitride layer and the first packaging layer, a composition of the third oxynitride layer comprises $SiN_{x3}O_{y3}$, a composition of the fourth oxynitride layer comprises $SiN_{x4}O_{y4}$, and $x3 \geq x4$.

4. The electronic device package of claim 3, wherein $x4 \geq x2$.

5. The electronic device package of claim 3, wherein in a composition of the fourth oxynitride layer, a content of the N element is 7 at % to 50 at %.

6. The electronic device package of claim 3, wherein the first oxynitride layer covers a top surface and a side surface of the second oxynitride layer, the fourth oxynitride layer covers a top surface and a side surface of the first oxynitride layer, and the third oxynitride layer covers a top surface and a side surface of the fourth oxynitride layer.

7. The electronic device package of claim 1, further comprising a surrounding structure layer, wherein the surrounding structure layer is disposed on the substrate, a thickness of the surrounding structure layer is greater than a thickness of the electronic device, and the electronic device is located in a region surrounded by the surrounding structure layer.

8. The electronic device package of claim 7, wherein a thickness of the first packaging layer is greater than, less than, or equal to the thickness of the surrounding structure layer.

9. The electronic device package of claim 7, wherein a radial width of the first packaging layer is gradually changed outward from the substrate.

10. The electronic device package of claim 1, further comprising a cover layer, wherein the electronic device is sandwiched between the substrate and the cover layer, and the cover layer is located between the first package layer and the substrate.

11. The electronic device package of claim 10, wherein a thickness of the cover layer is in a range of 1 μm to 50 μm.

12. The electronic device package of claim 10, wherein a refractive index of the cover layer is in a range of 1.4 to 1.8.

13. The electronic device package of claim 1, wherein a thickness of the first oxynitride layer is less than that of the second oxynitride layer.

14. The electronic device package of claim 1, wherein a thickness of the first oxynitride layer is 1 nm to 30 nm.

15. The electronic device package of claim 1, wherein a content of the doping element in the first oxynitride layer exceeds 0 at % to 5 at %.

16. The electronic device package of claim 1, wherein the doping element comprises hydrogen, nitrogen, oxygen, an inert gas, or a combination thereof.

17. The electronic device package of claim 1, wherein the first oxynitride layer is in direct contact with the second oxynitride layer.

18. The electronic device package of claim 1, wherein the first oxynitride layer covers a top surface and a side surface of the second oxynitride layer.

19. The electronic device package of claim 1, wherein a nitrogen content of the first oxynitride layer is gradually decreased toward the second oxynitride layer.

\* \* \* \* \*